United States Patent
Otsuga et al.

(10) Patent No.: US 7,994,822 B2
(45) Date of Patent: Aug. 9, 2011

(54) SEMICONDUCTOR DEVICE FOR SYNCHRONOUS COMMUNICATION BETWEEN STACKED LSI

(75) Inventors: Kazuo Otsuga, Kokubunji (JP); Kenichi Osada, Tokyo (JP); Makoto Saen, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/690,659

(22) Filed: Jan. 20, 2010

(65) Prior Publication Data
US 2010/0182046 A1   Jul. 22, 2010

(30) Foreign Application Priority Data
Jan. 21, 2009   (JP) .................. 2009-010499

(51) Int. Cl.
*H03K 19/00* (2006.01)
(52) U.S. Cl. .......................... 326/93; 326/101
(58) Field of Classification Search .............. 326/93–94, 326/101, 21
See application file for complete search history.

(56) References Cited

U.S. PATENT DOCUMENTS

| | | | |
|---|---|---|---|
| 6,331,800 B1 * | 12/2001 | Radjassamy | 327/566 |
| 6,452,421 B2 * | 9/2002 | Saito | 326/93 |
| 2009/0021974 A1 | 1/2009 | Nonomura et al. | |
| 2009/0031053 A1 | 1/2009 | Nonomura et al. | |
| 2009/0154629 A1 * | 6/2009 | Pyeon et al. | 375/376 |
| 2009/0245445 A1 | 10/2009 | Saen et al. | |

FOREIGN PATENT DOCUMENTS
JP    2008-047768 A    2/2008

* cited by examiner

*Primary Examiner* — James Cho
(74) *Attorney, Agent, or Firm* — Miles & Stockbridge P.C.

(57) ABSTRACT

The performance of a whole system is improved by synchronizing communication and computations between stacked computing LSIs. Each of stacked an external communication LSI and a computing LSI has a PLL which multiplies a crystal oscillator clock signal, a clock pulse generator which distributes the clock signal, and flip-flop circuits. The computing LSI has a DLL circuit composed of a clock phase comparator, a delay controller, and a delay chain. In order to synchronize the communication and computations of the external communication LSI and the computing LSI, a synchronization reference clock signal is transmitted from the external communication LSI to the computing LSI via a through-electrode. An internal clock signal of the computing LSI is synchronized with the synchronization reference clock signal from the external communication LSI by the DLL circuit.

5 Claims, 14 Drawing Sheets

SEMICONDUCTOR DEVICE FOR SYNCHRONOUS COMMUNICATION BETWEEN STACKED LSI

CROSS-REFERENCE TO RELATED APPLICATION

The present application claims priority from Japanese Patent Application No. JP 2009-010499 filed on Jan. 21, 2009, the content of which is hereby incorporated by reference into this application.

TECHNICAL FIELD OF THE INVENTION

The present invention relates to a semiconductor device and more particularly relates to a method of synchronization between LSIs stacked in three-dimensional directions.

BACKGROUND OF THE INVENTION

In recent years, the demands for downsizing and performance enhancement in electronic devices are expanding more and more. The key devices that determine the downsizing and performance enhancement are LSIs (Large Scale Integration) mounted on devices.

Along with progress in microfabrication techniques, the performance of LSIs has been improved by integrating more transistors on one chip. However, due to influences of limitations in miniaturization, increase in usage cost of most-advanced processes etc., advancing integration onto one chip as is conventionally done is not always an optimal solution. Therefore, integration in three-dimensional directions implemented by stacking a plurality of LSIs is a promising technique.

FIG. 14 illustrates an LSI composed by combining a large number of logic circuits. The LSI 1 is equipped with processor units (PU1, PU2), a memory controller (MEMC), a peripheral circuit (PERI) such as an interrupt controller, and a bus (BUS) mutually connecting signals thereof. A crystal oscillator (Crystal), which supplies a reference clock signal, is installed outside of the LSI 1. The interior of the LSI 1 is equipped with a PLL circuit (PLL), which multiplies the frequency of the reference clock signal, and a clock pulse generator (CPG), which appropriately subjects the PLL output clock signal to frequency dividing and distributes clock signals to the circuit blocks of PU1, PU2, MEMC, and PERI. These circuit blocks are connected to the bus (BUS) by wiring (SI1, SI2, SI3, SI4). Thus, information can be mutually transmitted among PU1, PU2, PERI, and MEMC. PU1, PU2, PERI, and MEMC have a configuration in which a large number of logic circuits are combined as illustrated in FIG. 15. The clock signals supplied to flip-flop circuits of these logic circuits are supplied by clock wiring (CLK_PU, CLK_BUS, CLK_MEMC, CLK_PERI).

FIG. 15 is a diagram illustrating the logic circuit used in FIG. 14, which is formed in one chip. This logic circuit is composed of the plurality of flip-flop circuits (FF), a combinational circuit (Comb), clock wiring (CLK1), input ports (IN1, IN2, IN3), and output ports (OUT1, OUT2, OUT3). The logic circuit operates in synchronization with the clock signal. More specifically, the signals of IN1 to IN3 are latched by the flip-flop circuits at the rising or falling edge of the clock signal and input to the combinational circuit, which is in a subsequent stage. The results of computations carried out in the combinational circuit are latched by the flip-flop circuits of a subsequent stage at next rising and falling edges of the clock signal and output to OUT1 to OUT3. As described above, this operation is executed in synchronization with the clock signals distributed to the flip-flops. In other words, the computations are synchronized. Therefore, when the phases of the clock signals distributed to the flip-flops are mutually shifted, malfunctions are caused, for example, the flip-flops of the subsequent stage cannot latch correct signals. This shift in the phase of the clock signals is generally called clock skew.

In Japanese Patent Application Laid-Open Publication No. 2008-047768 (Patent Document 1), as a method of reducing the clock skew, a technique of stacking an LSI composed only of flip-flop circuits and clock wiring and an LSI composed only of combinational logic circuits is mentioned.

SUMMARY OF THE INVENTION

In order to achieve further performance improvement, reduction in power consumption, and improvement in space efficiency in above-described background techniques, the inventors of the present invention considered that it is effective to also stack a plurality of computing LSIs such as processors in combination with memory LSIs. However, as is described in detail below, it is difficult to expect performance improvement of a whole system only by simply stacking a plurality of computing LSIs and connecting them by wire bonding. FIG. 16 illustrates a configuration in which LSI_A and LSI_B are connected to each other by external interface wiring (IF_AB). The external interface wiring is composed of wire bonding and substrate wiring on a system board. LSI_A is equipped with a processor unit (PU_A) and an external interface circuit (IF_A). Clock signals for the circuit blocks are supplied from clock wiring (CLK_A, CLK_B). Similarly, LSI_B is equipped with a processor unit (PU_B) and an external interface circuit (IF_B). Clock signals for the circuit blocks are supplied from clock wiring (CLK_B, CLK_C). The operation in which the processor unit (PU_A) of LSI_A communicates with the processor unit (PU_B) of LSI_B will be described. Transmission data of the processor unit (PU_A) synchronized with the signal of CLK_A is retrieved by a logic circuit of the external interface circuit (IF_A) via connection wiring (SIA). Here, the retrieving logic circuit of the external interface circuit (IF_A) is synchronized with CLK_A. Herein, PU_A and IF_A are directly connected to each other; however, they may be connected via a bus therebetween. Generally, a clock frequency for chip external communication and a clock frequency of a chip internal circuit block are different from each other and are not synchronized. In FIG. 16, the clock frequency for chip external communication is CLK_B, and the clock frequency for chip internal circuit block is CLK_A. Therefore, in the external interface circuit (IF_A), asynchronous communication has to be carried out between the logic circuit synchronized by CLK_A and a logic circuit synchronized by CLK_B. After the transmission data is retrieved by the logic circuit synchronized by CLK_B, the data is retrieved by the external interface circuit (IF_B) of LSI_B via IF_AB by using a predetermined communication protocol. Herein, CLK_B of LSI_A and CLK_B of LSI_B are not synchronized with each other. The data retrieved by the external interface circuit undergoes asynchronous communication between a logic circuit operated by CLK_B and a logic circuit operated by CLK_C and then transmitted to the processor unit PU_B. In this manner, the communication between LSIs is generally asynchronous communication. Therefore, among the steps of: (1) computations by LSI_A; (2) transferring the computation results of LSI_A to LSI_B;

and (3) computations by LSI_B, particularly (2) serves as a bottleneck and prevents improvement in processing performance, which is a problem.

Patent Document 1 employs the configuration in which two chips are stacked. However, the two chips are a chip forming logic circuits and a chip forming flip-flops, which do not solve the above-mentioned problem of the asynchronous transfer between different chips. The typical ones of the inventions disclosed in the present application will be briefly described as follows.

A first LSI has a plurality of first flip-flops, to which a first clock signal is supplied, and a first logic circuit connected between the plurality of first flip-flops; and a second LSI is formed on a chip different from a chip of the first LSI and has a plurality of second flip-flops, to which a second clock signal is supplied, and a second logic circuit connected between the plurality of second flip-flops; wherein the first LSI and the second LSI are stacked in one semiconductor package; the first LSI transmits data to the second LSI based on the first clock signal; the second LSI receives the data transmitted from the first LSI based on the second clock signal; and the second clock signal is controlled so that the phase thereof matches that of the first clock signal.

To simply explain the effects obtained by typical aspects of the invention disclosed in the present application, the communication between three-dimensionally stacked computing LSIs can be carried out at a high speed.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
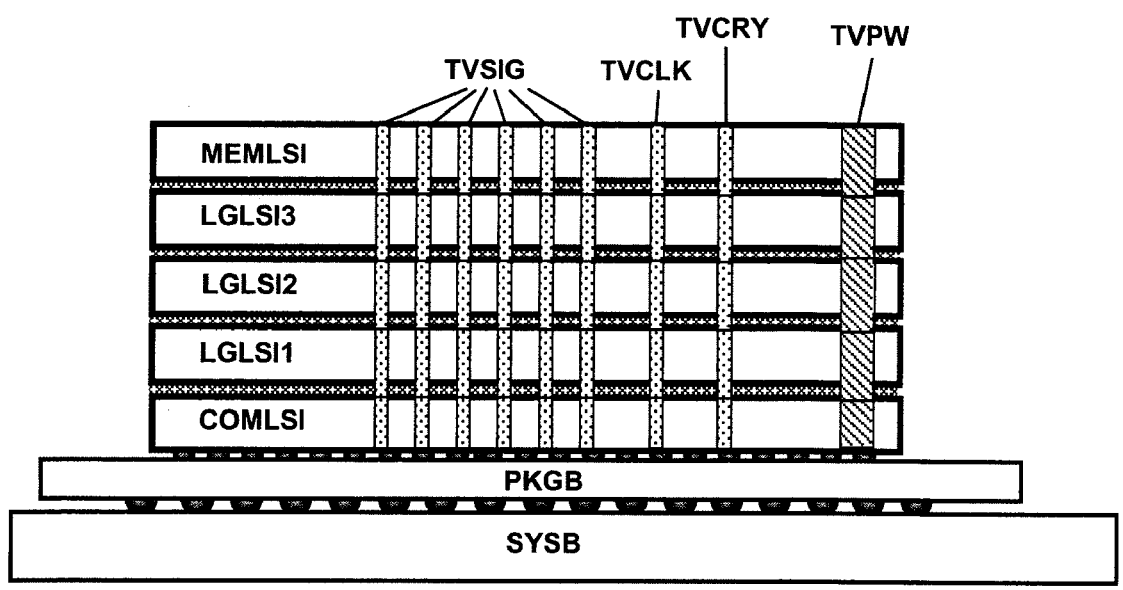
FIG. 1 is an explanatory diagram of a package of stacked LSIs according to a first embodiment.

FIG. 1 illustrates an aspect of stacked LSIs according to a first embodiment of the present invention. A cross section of the stacked layers of the stacked LSIs is illustrated. In the present aspect, an external communication LSI (COMLSI) is stacked on the top layer of a package board PKGB, three layers of computing LSIs (LGLSI) equipped with computing units are stacked on the top layer of COMLSI, and one layer of a memory LSI (MEMLSI) which stores data is further stacked on the top layer of LGLSIs. The external communication LSI is provided with a circuit which carries out high-speed wire communication at a communication frequency exceeding 1 GHz with the components on a system board outside of the stacked LSIs, and high-speed communication with outside of the stacked LSIs is carried out via this external communication LSI. The memory LSI corresponds to a DRAM, SRAM, flash memory, magnetic memory, or the like. The computing LSIs correspond to LSIs equipped with general-purpose processors such as CPUs, dedicated processors such as graphics accelerators, dynamically reconfigurable processors in which a large number of computing circuits such as adders and multipliers are arranged and mutually connected by switch circuits, and FPGAs.

As described above, features of the present invention resides in stacking the external communication LSI, the computing LSIs, and the memory LSI, which are mutually different chips, in this order in one semiconductor package and mutually connecting the LSIs by through-electrodes so as to carry out high-speed large-capacity communication by the shortest path compared with wire bonding and board wiring on a system board. Herein, a silicon through-electrode is formed by forming a hole in a silicon board and filling the hole with a conductive substance, thereby electrically connecting the stacked LSIs to each other.

In FIG. 1, TVPW denotes a silicon through-electrode for supplying power. TVPW is the silicon through-electrode for supplying common power to the memory LSI and the computing LSIs, and a power source is connected to a power source line of the memory LSI and the computing LSIs from the external communication LSI via TVPW.

TVCRY is a silicon through-electrode for supplying a reference clock signal generated from an external crystal oscillator. The reference clock signal is connected from the external communication LSI to PLLs of the memory LSI and the computing LSIs via TVCRY. Note that the memory LSI is not equipped with a PLL in some cases. Similarly, TVCLK is a silicon through-electrode for supplying a reference clock signal for synchronization of the LSIs, which will be explained later.

Next, the paths of communication between the LSIs and outside of the package in the present embodiment will be described. The communication between the external communication LSI, the computing LSIs, and the memory LSI is carried out via silicon through-electrodes TVSIG. The communication between the external communication LSI and LSIs outside of the package is carried out via the package board PKGB. The term "communication" herein does not mean communication in the narrow sense, but means input/output of all the information including reset signals, endian signals, initial-value signals of operating frequencies, terminal setting, etc., identifier signals of the LSIs, and so on except the power source.

In a typical operation of this system, the external communication LSI reads processing target data such as images and communication packets from outside of the package to the stacked memory LSI, and the computing LSIs subject the data to some sort of computation processing. Then, the result thereof is stored in the memory LSI, and the external communication LSI outputs the result from the memory LSI to an external storage or a network.

In the present embodiment, TVSIG penetrating and connecting all the LSIs is described. However, the electrode is not necessarily limited to this, and silicon through-electrodes mutually connecting only part of the LSIs may be provided in combination. In that case, the capacity and resistance of the silicon through-electrodes are reduced, and thus high-speed communication can be carried out.

In the embodiment of FIG. 1, the stacked LSIs are directly connected to each other. However, in some cases, interposer layers having wiring for terminal position adjustment are inserted between the memory LSI and the computing LSI and between the memory LSI and the external communication LSI. This is required, for example, when the position of the silicon through-electrode of the memory LSI and the position of the silicon through-electrode of the computing LSI do not match. A rewiring layer can be also used for the same purpose.

Figure 2:
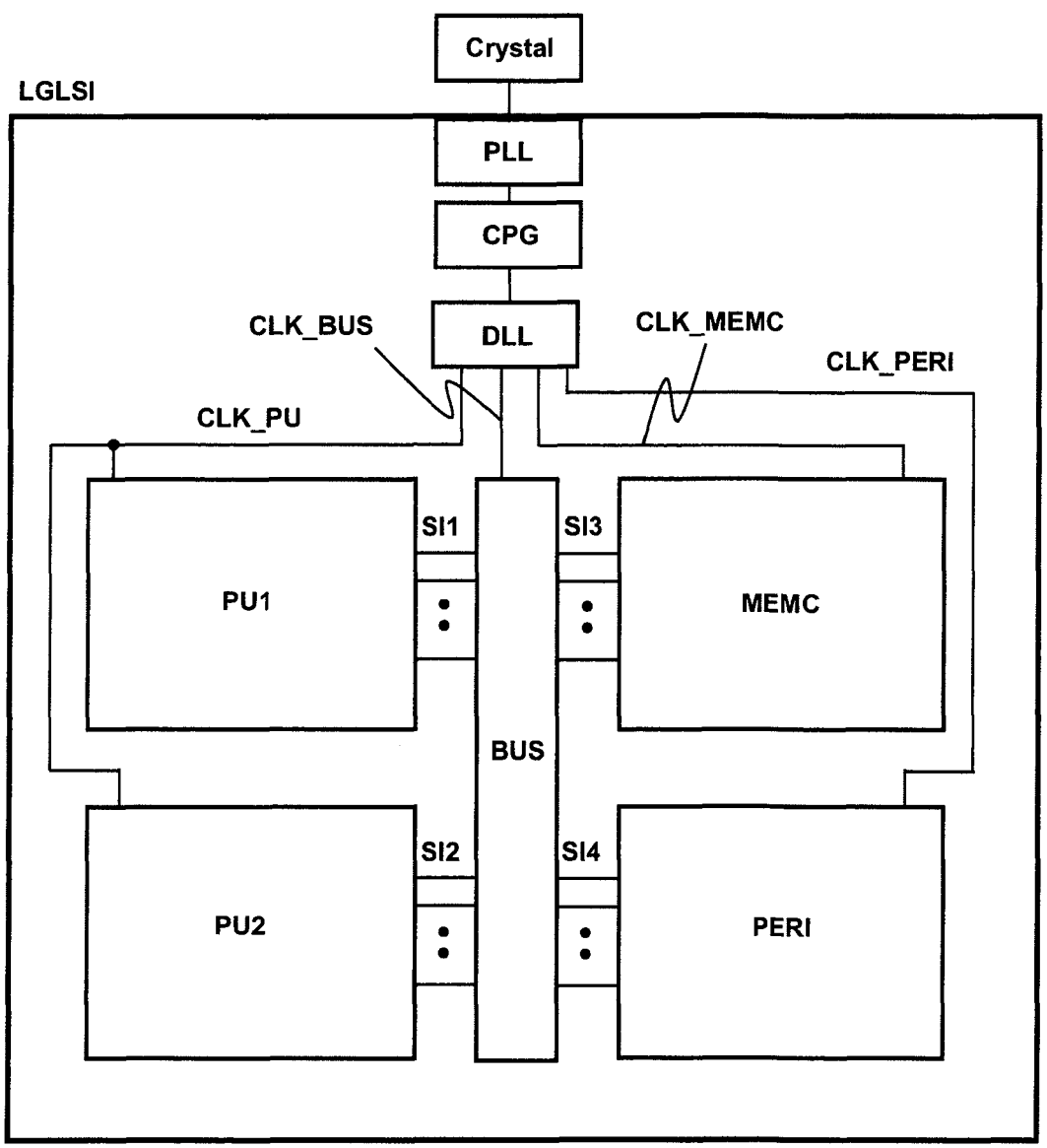
FIG. 2 is an explanatory diagram illustrating a stacked computing LSI according to the first embodiment.
Figure 14:
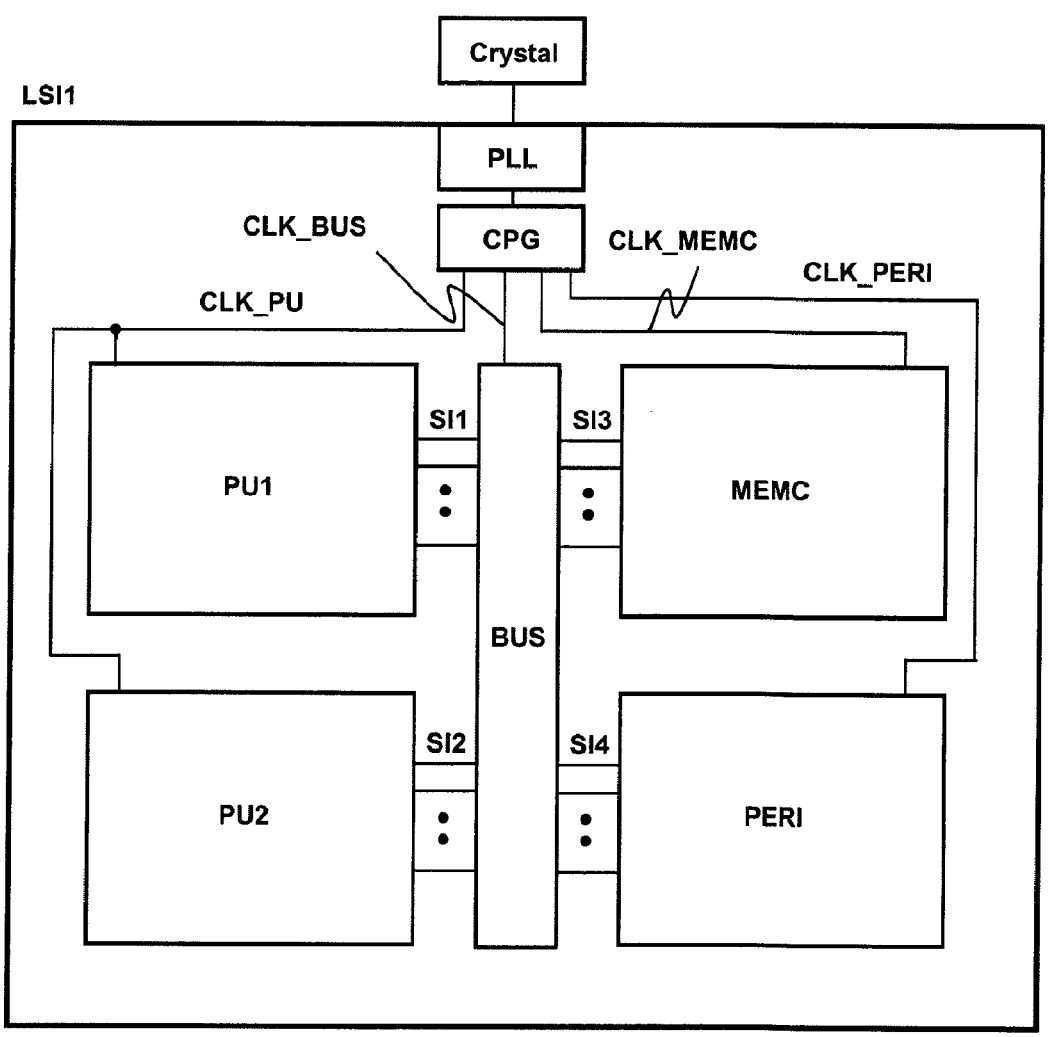
FIG. 14 is an explanatory diagram illustrating a synchronous LSI.
Figure 15:
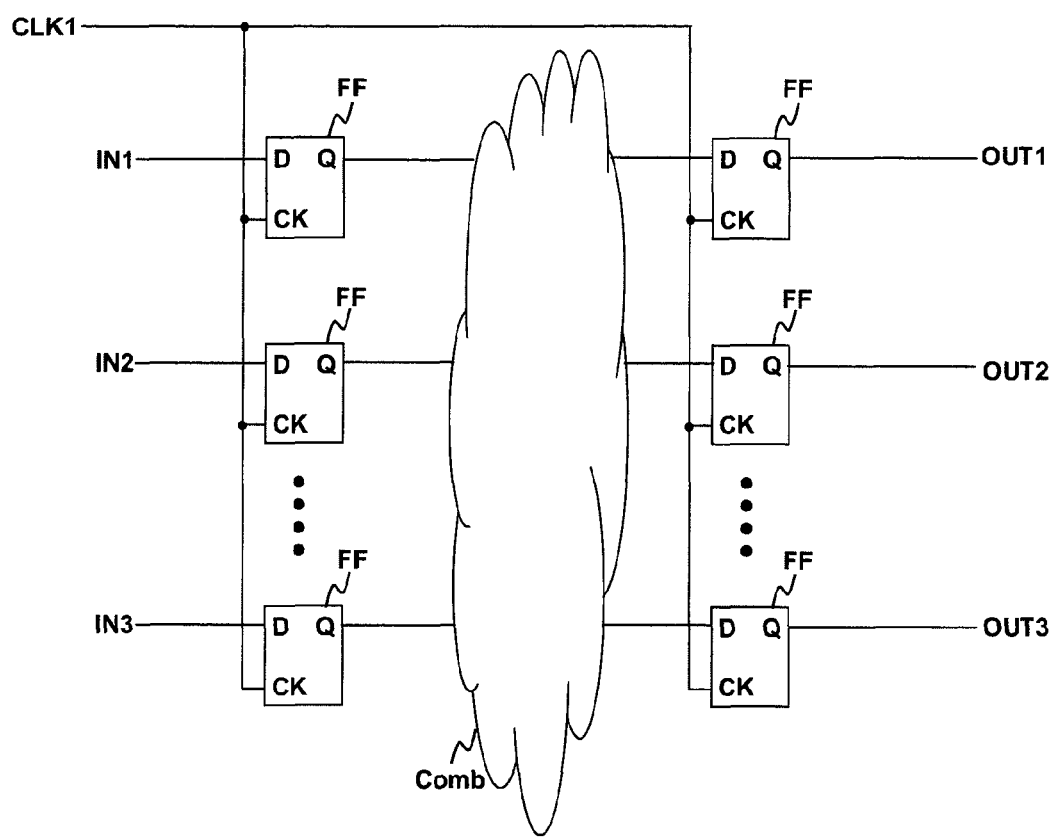
FIG. 15 is an explanatory diagram illustrating a synchronous logic circuit.
Figure 16:
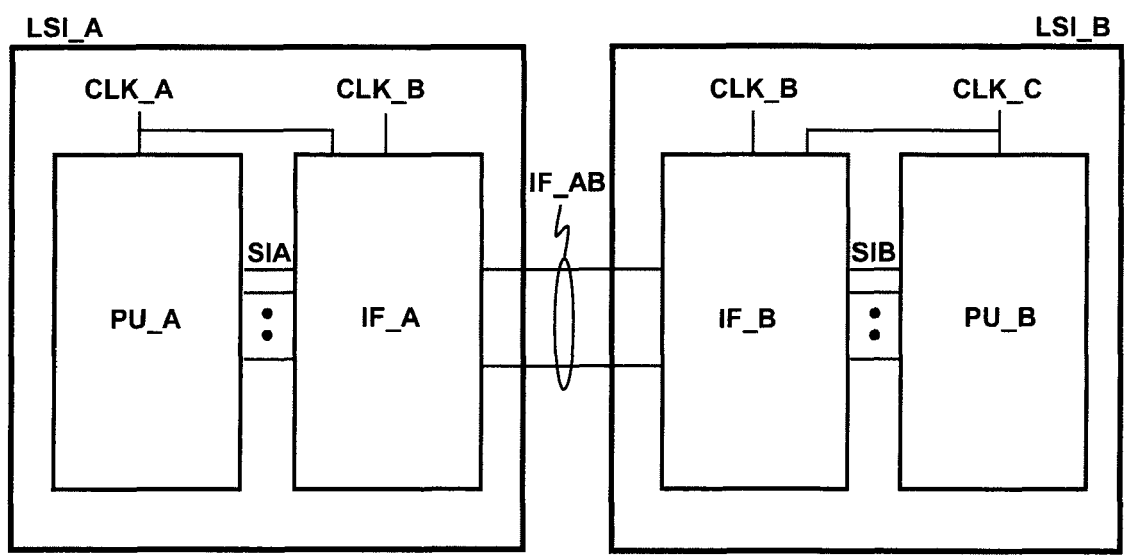
FIG. 16 is an explanatory diagram illustrating asynchronous communication between LSIs.

FIG. 2 illustrates an aspect of the computing LSI (LGLSI) illustrated in FIG. 1. Note that, although the plurality of computing LSIs illustrated in FIG. 1 may have mutually different configurations, the computing LSIs in the present embodiment have the same configuration for the reason described later. LGLSI is equipped with processor units (PU1, PU2), a memory controller (MEMC), a peripheral circuit (PERI) such as an interrupt controller, and a bus (BUS) mutually connecting signals thereof. In addition, LGLSI is equipped with a PLL circuit (PLL), which receives a reference clock signal output from a crystal oscillator (Crystal) via a silicon through-electrode and multiplies the frequency of the reference clock signal, and a clock pulse generator (CPG), which appropriately subjects a PLL output clock signal to frequency dividing and distributes clock signals to the circuit blocks of PU1, PU2, MEMC, and PERI. The processor units correspond to CPUs (Central Processor Units) or DSPs (Digital Signal Processors). The processor units may be hardware IPs (Intellectual Properties) specialized for video processing or audio processing. Note that, although the number of the processor units is two here, the number is not limited to this. The circuit blocks are connected to the bus (BUS) by wiring (SI1, SI2, SI3, SI4). Thus, PU1, PU2, PERI, and MEMC can mutually transmit information. PU1, PU2, PERI, and MEMC have a configuration in which a large number of logic circuits are combined as illustrated in FIG. 14, and the clock signals supplied to flip-flop circuits of these logic circuits are supplied by clock wiring (CLK_PU, CLK_BUS, CLK_MEMC, CLK_PERI). Herein, the clock wiring (CLK_PU) supplied to PU1 and PU2 is the same; however, individual clock wiring may be used. In that case, PU1 and PU2 can be operated by mutually different clock frequencies depending on the amount of load. Similarly, the clock frequencies distributed to the processor units, the memory controller, the peripheral circuit, and the bus may be mutually different. However, since the clock signals are synchronized, computations of the processor units, the memory controller, the peripheral circuit, and the bus are synchronized. Moreover, in the present embodiment, one DLL circuit (DLL) for phase adjustment is mounted, the DLL circuit supplying a clock synchronized with the clock of the computing LSI formed on another chip to the processor units (PU1, PU2), the memory controller (MEMC), the peripheral circuit (PERI) such as an interrupt controller, and the bus (BUS) mutually connecting signals thereof.

Figure 3:
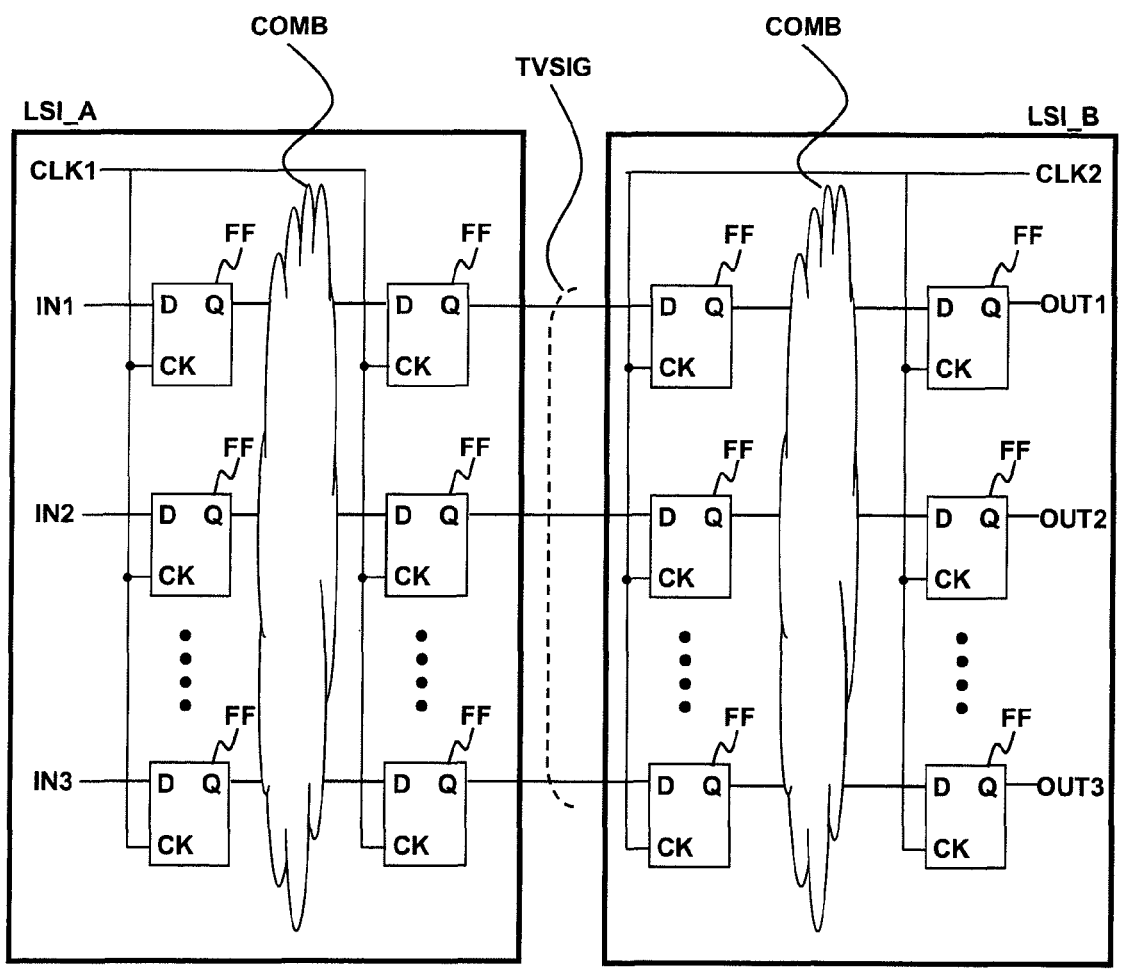
FIG. 3 is an explanatory diagram illustrating synchronous communication between LSIs.

FIG. 3 is a schematic diagram illustrating data communication paths of the two layers of the computing LSIs (LSI_A, LSI_B). As shown in FIG. 3, in the two layers of the computing LSIs, flip-flops FF are mutually connected via the silicon through-electrodes TVSIG. The computing LSI (LSI_A) includes logic circuits composed of the plurality of flip-flop circuits (FF), a combinational circuit (COMB), clock wiring (CLK1), and input ports (IN1, IN2, IN3). The logic circuits are included in the processing units (PU1, PU2) of the computing LSI (LSI_A) as illustrated in FIG. 2. Also, the computing LSI (LSI_B) includes logic circuits composed of the plurality of flip-flop circuits (FF), a combinational circuit (COMB), clock wiring (CLK2), and output ports (OUT1, OUT2, OUT3). The logic circuits are similarly included in the processing units (PU1, PU2) of the computing LSI (LSI_B).

The logic circuits of the computing LSI (LSI_A) operate in synchronization with a clock signal (CLK1). At a rising or falling edge of the clock signal (CLK1), the signals of IN1 to IN3 are latched by the flip-flop circuits and input to the combinational circuit of the subsequent stage. The results of the computations carried out in the combinational circuit are latched by the flip-flop circuits of the subsequent stage at a next rising or falling edge of the clock signal and output to the computing LSI (LSI_B) via the silicon through-electrodes TVSIG. On the other hand, the logic circuits of the computing LSI (LSI_B) operate in synchronization with a clock signal (CLK2). At a rising or falling edge of the clock signal (CLK2), the signals of the silicon through-electrodes TVSIG are latched by the flip-flop circuits and input to the combinational circuit of the subsequent stage. The results of the computations carried out in the combinational circuit are latched by the flip-flop circuits of the subsequent stage at a next rising or falling edge of the clock signal and then output to a subsequent stage.

In the present embodiment, the clock signals CLK1 and CLK2 supplied to the communication logic circuits of LSI_A and LSI_B formed on different chips are controlled so as to be synchronized with each other. Therefore, data transmission and reception like that between synchronized on-chip flip-flops can be carried out, and thus communication latency can be reduced. As a result, data in small processing units can be transmitted between the LSIs, and computations thereof can be carried out in the LSIs.

Further, in the present embodiment, since the flip-flops of the computing LSI (LSI_A) and the computing LSI (LSI_B) are configured to be mutually connected by the through-electrodes, it is important that they are exactly above or below each other in the positional relation thereof. Therefore, the computing LSIs of the same type are desired to be stacked as the positional relation is maintained when the computing LSI (LSI_A) and the computing LSI (LSI_B) have the same configuration. However, it goes without saying that the positions of the flip-flops connected to different chips can be determined in advance or that positional shift can be corrected by interposers or the like as described above.

Figure 4:
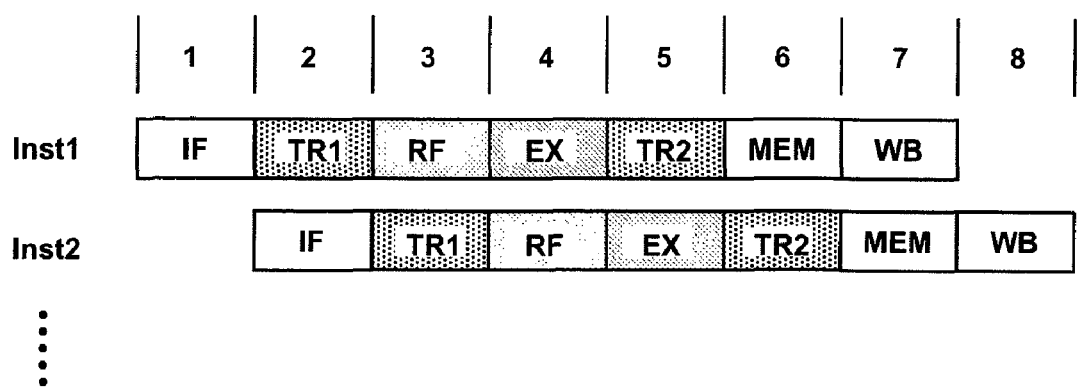
FIG. 4 is an explanatory diagram illustrating pipeline processing.

When the communication and computations between the LSIs are synchronized, data in small processing units can be mutually transmitted between the LSIs. For example, FIG. 4 illustrates a case in which pipeline processing of a CPU is carried out by the two LSIs. The pipeline processing is assumed to be composed of five processing units, i.e., instruction fetch (IF), instruction decode (RF), instruction execution (EX), operand fetch (MEM), and write back (WB). The pipeline processing of an instruction 1 (Inst1) is as described below. IF is processed in LSI_A, the result of IF is transferred to LSI_B at the cycle of TR1, and RF and EX are carried out in LSI_B. At the cycle of TR2, the result of EX is transferred to LSI_A, and MEM and WB are carried out in LSI_A. Processing is similarly carried out also after an instruction 2 (Inst2). In this manner, the small processing units can be distributed over the plurality of LSIs when the communication and computations between the LSIs are synchronized. When the LSIs are specialized for individual processing units, the computation throughput of the whole system can be improved.

Figure 5:
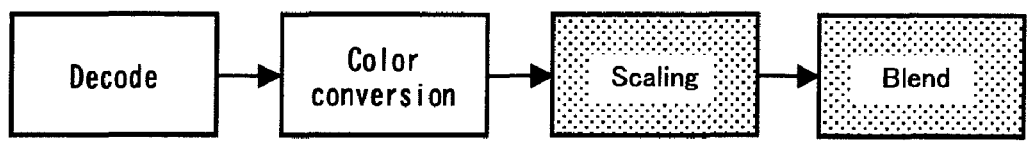
FIG. 5 is an explanatory diagram illustrating video decoding processing.

FIG. 5 illustrates decoding processing of video, which is an example in which the processing units thereof are larger than those of the pipeline operation of FIG. 4. The decoding processing units of the video are composed of decoding (Decode) processing which decodes encoded stream data, color conversion (Color conversion) processing, scaling (Scaling) processing, and blending (Blend) processing. In the example of FIG. 5, the decoding processing and the color conversion processing are carried out in LSI_A, the result thereof is transferred to LSI_B, and the scaling processing and the blending processing are carried out in LSI_B. Herein, the decoding processing of video is described as an example. However, the operation of the case in which the communication and computations between the LSIs are synchronized is not limited to this, and the operation can be applied to encoding processing of video and image processing.

Figure 6:
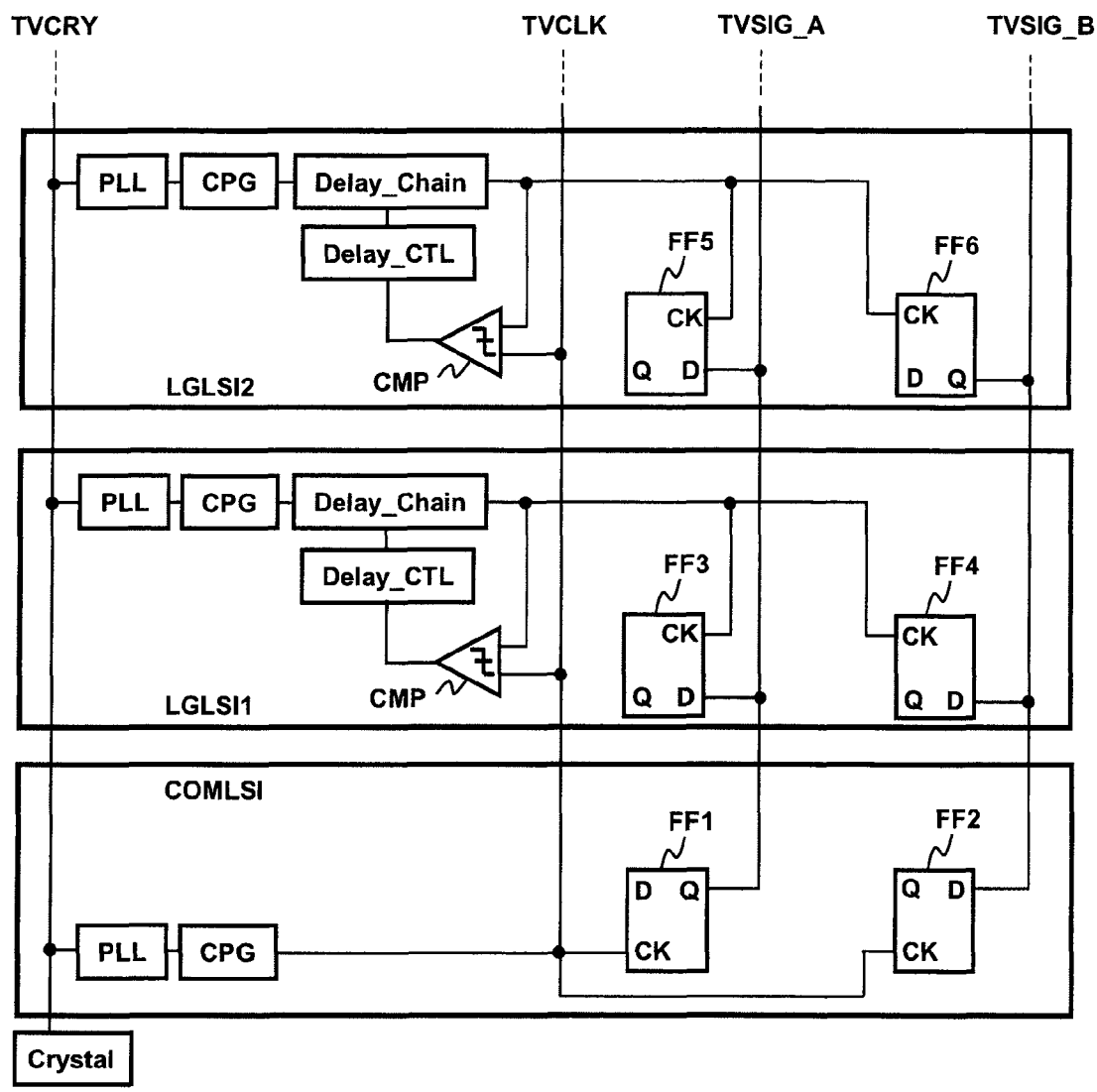
FIG. 6 is an explanatory diagram illustrating a circuit system of synchronization between stacked LSIs according to the first embodiment.

FIG. 6 illustrates a diagram of a circuit which enables synchronization of the communication and computations between the LSIs according to the first embodiment of the present invention. The configuration of FIG. 1 in which the external communication LSI and the two layers of the computing LSIs are stacked is specifically illustrated. Each of the LSIs is equipped with a PLL which multiplies a crystal oscillator clock signal, a clock pulse generator which distributes the clock signal, and flip-flop circuits. Each of the computing LSIs is equipped with a clock phase comparator (CMP), a delay controller (Delay_CTL), and a delay chain (Delay_Chain). The phase comparator, the delay controller, and the delay chain are collectively called a DLL circuit. In order to synchronize the communication and computations of the LSIs, a synchronization reference clock signal is input to the clock phase comparators of the computing LSIs LGLSI1 and LGLSI2 from the external communication LSI via the through-electrode (TVCLK). The data transmitted from FF1 of the external communication LSI is input to the flip-flop circuits of the computing LSIs via a through-electrode (TVSIG_A). The data transmitted from FF6 of LGLSI2 is input to the flip-flop circuits of the LGLSI1 and the external communication LSI via a through-electrode (TVSIG_B). In FIG. 6, only the flip-flop circuits related to the communication between the LSI circuits are described, and combinational circuits and other circuit blocks are not illustrated.

An operation of the present system will be described. In order to synchronize the communication and computations between the external communication LSI and LGLSI1, the phase differences in the clocks supplied to FF1, FF2, FF3, and FF4 have to be in the state that they are shifted by the amount corresponding to the wiring delay between LGLSI1 and the external communication LSI. Also, in order to synchronize the communication and computations between the external communication LSI and LGLSI2, the phase differences in the clocks supplied to FF1, FF2, FF5, and FF6 have to be in the state that they are shifted by the amount corresponding to the wiring delay between LGLSI2 and the external communication LSI. The synchronization reference clock signal from the external communication LSI is input to the clock phase comparators of LGLSI1 and LGLSI2 via the through-electrode (TVCLK). At this point, the synchronization clock signal input to LGLSI1 and LGLSI2 is in the state that it is shifted by a phase difference corresponding to the wiring delay between the corresponding computing LSI and the external communication LSI. The individual clock signals of LGLSI1 and LGLSI2 are input to the phase comparators, respectively, via PLL, CPG, and Delay_Chain. The phases of the individual clock signals in the computing LSIs are adjusted by DLL, thereby setting the individual clock signals to the state in which the phases thereof are shifted from the synchronization clock signal of the external communication LSI by the amount corresponding to the wiring delay. As a result, the communication and computations of the external communication LSI, LGLSI1, and LGLSI2 are synchronized. Since the communication and computations of LGLSI1 and LGLSI2 are synchronized, small processing units can be distributed over the individual computing LSIs, and the computation throughput of the whole system can be improved.

In the present embodiment, the reference clock signal from the crystal oscillator (Crystal) is supplied to the computing LSIs and the external communication LSI via the silicon through-electrode. Therefore, the reference clock signals distributed to the LSIs contain a wiring delay of the amount corresponding to the silicon through-electrode, and the LSIs can be mutually synchronized by using the clock signals output from the PLL circuit. However, in the present embodiment, the DLL circuit is provided in addition to PLL, and the clock signal used in the internal operation of the other LSI is configured to be received as the synchronization reference clock signal via TVCLK. This is for suppressing clock phase differences between the LSIs caused by process variations and dynamic noise generated in the clock pulse generators, etc.

Figure 7:
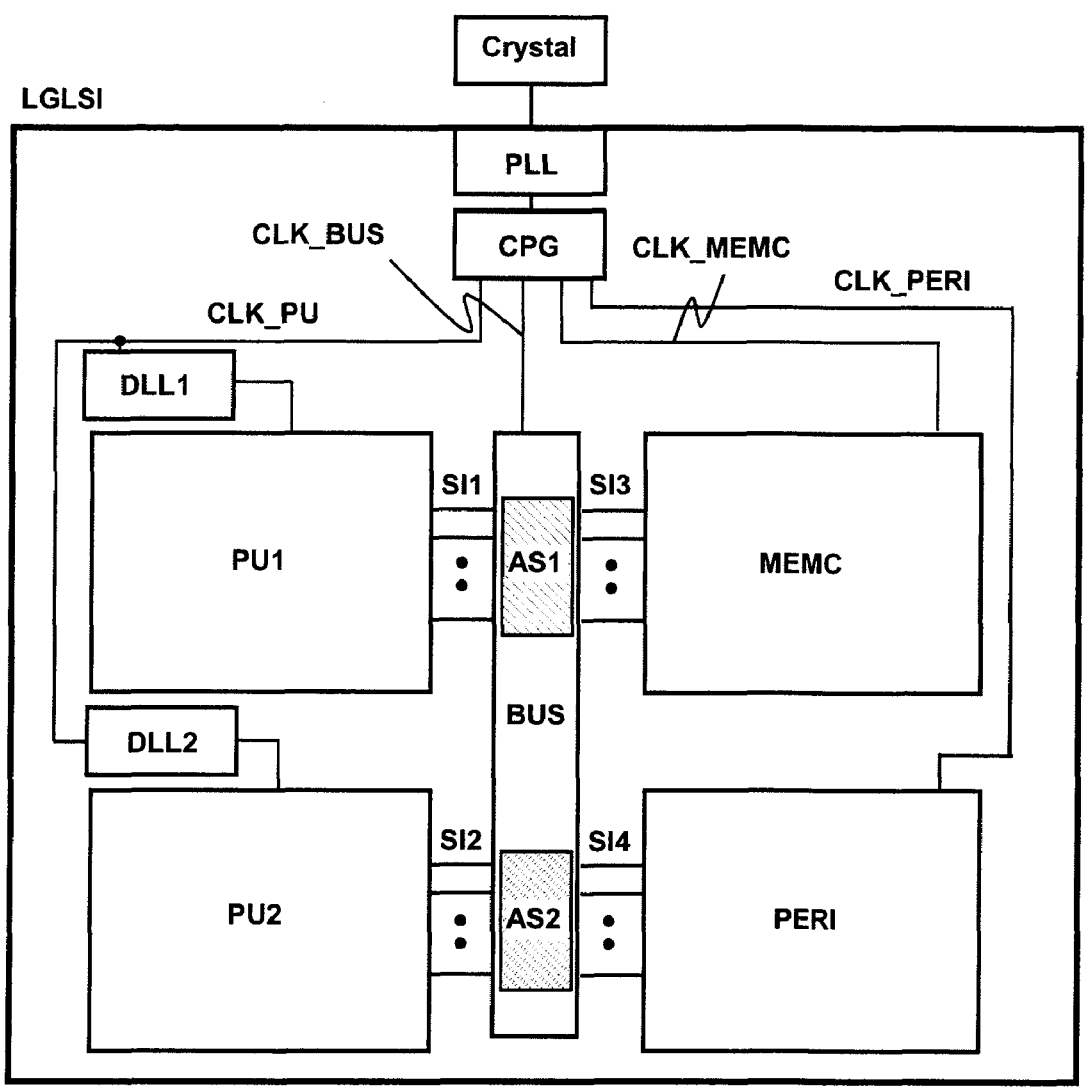
FIG. 7 is an explanatory diagram illustrating a stacked computing LSI according to a second embodiment.

FIG. 7 illustrates an aspect of a computing LSI according to a second embodiment of the present invention. The LSI 3 is characterized in that the processor units (PU1, PU2), which are communication circuit blocks, are equipped with DLL circuits for phase adjustment, respectively, and the clocks synchronized with an external reference clock signal can be supplied to the processor units (PU1, PU2) by the DLL circuits. As a result, compared with the example of FIG. 2, frequencies corresponding to the load of the processor units can be set, respectively, and power consumption can be reduced. On the other hand, the clocks between PU1 and PU2 or among PU1, PU2, and BUS are no longer synchronized. Therefore, data is transmitted and received between the circuit blocks via asynchronous communication circuits AS1 and AS2. Specifically, AS1 is used in the asynchronous communication between PU1 and BUS, and AS2 is used in the asynchronous communication between PU2 and BUS.

Figure 8:
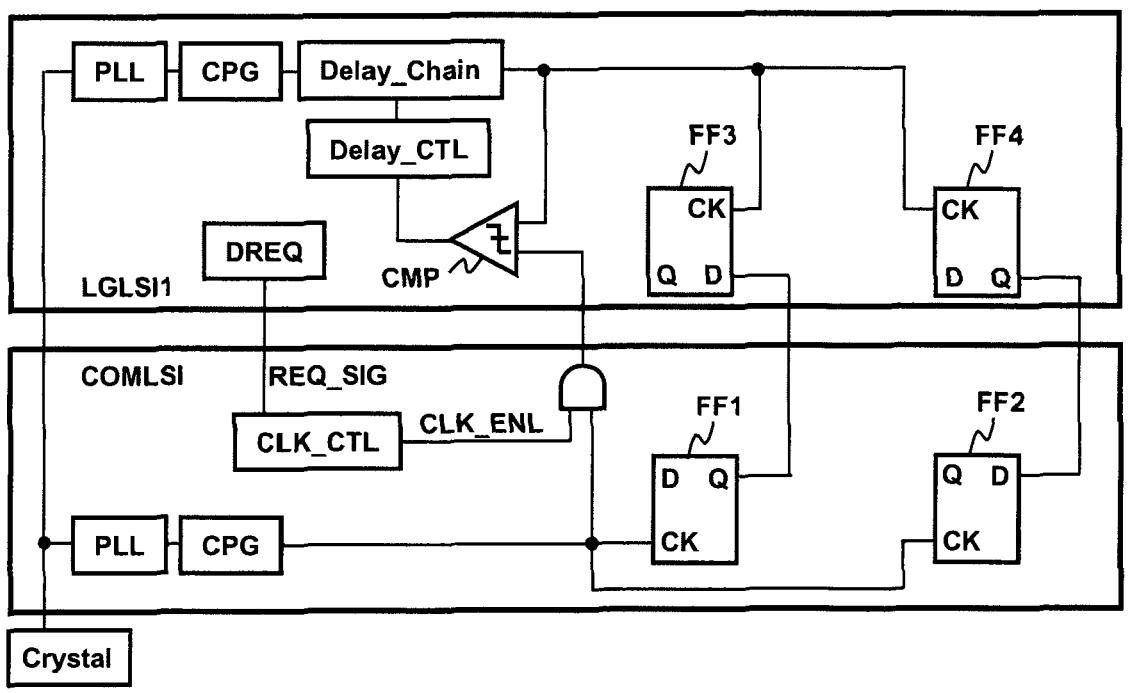
FIG. 8 is an explanatory diagram illustrating a circuit system of synchronization between stacked LSIs according to a third embodiment.

FIG. 8 illustrates a circuit diagram which enables synchronization of communication and computations between computing LSIs according to a third embodiment of the present invention. When the synchronization reference clock signal supplied from the external communication LSI is always being transmitted, the power consumption for wiring capacity charge/discharge due to toggling of the clock signal is increased. Therefore, in the present system, the synchronization reference clock signal is transmitted only upon communication, thereby reducing the synchronization reference clock transmission power. Operation examples include the case in which the external communication LSI is to transmit data to LGLSI1 and the case in which LGLSI1 is to request data to the external communication LSI. When the external communication LSI is to transmit data to LGLSI1, a clock controller (CLK_CTL) asserts a clock enable signal (CLK_ENL) and transmits a synchronization reference clock to LGLSI1. After waiting for several cycles for carrying out phase adjustment, data is transmitted from FF1 to FF3. On the other hand, when LGLSI1 is to request data to the external communication LSI, a data request controller DREQ provided in LGLSI1 asserts a request signal REQ_SIG. As a result, CLK_CTL, which has caught the data request, asserts CLK_ENL and starts transmission of the synchronization reference clock. The operation thereafter is similar to that described above. In this manner, in the present embodiment, the synchronization reference clock transmission power can be reduced by transmitting the synchronization reference clock signal only upon communication.

Figure 9:
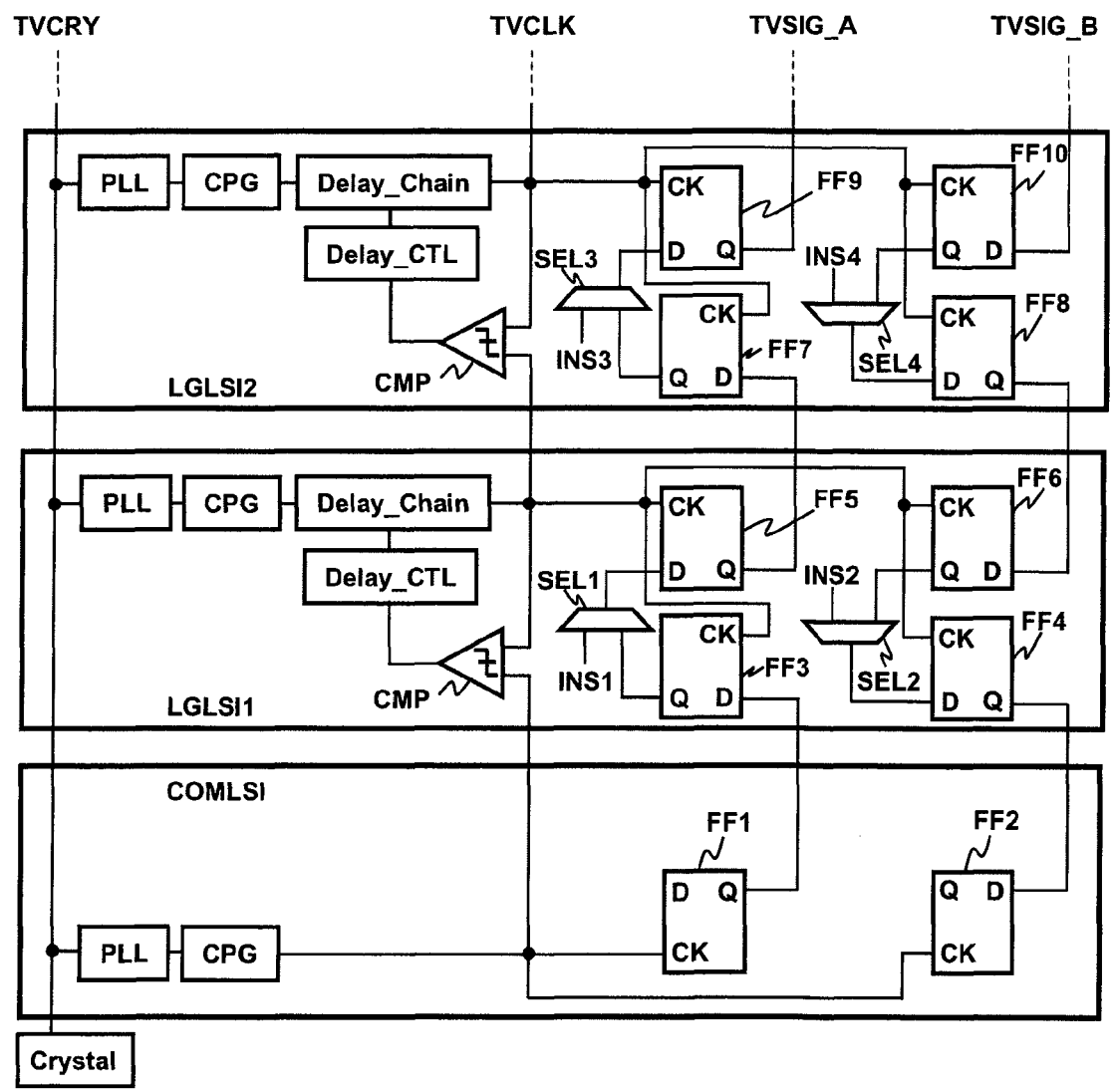
FIG. 9 is an explanatory diagram illustrating a circuit system of synchronization between stacked LSIs according to a fourth embodiment.

FIG. 9 illustrates a diagram of a circuit which enables synchronization of communication and computations between computing LSIs according to a fourth embodiment of the present invention. A point different from the first embodiment is that data transmission between the flip-flops is carried out only between adjacent LSIs. An advantageous point of such a configuration is that the number of through-electrodes can be reduced as is described below.

In the first embodiment, as shown in FIG. 6, data can be directly transmitted from FF1 of the external communication LSI to FF3 of LGLSI1 and FF5 of LGLSI2. On the other hand, in the present embodiment, as shown in FIG. 9, when data is to be transmitted from the external communication LSI to LGLSI2, the signal thereof is once latched by a flip-flop circuit FF3 of LGLSI1 and then transmitted to LGLSI2 via a selector SEL1 and the flip-flop circuit FF5. The clock signal of LGLSI1 synchronized with the external communication LSI is transmitted to LGLSI2 as the synchronization reference clock signal for LGLSI2. Meanwhile, in the first embodiment, the number of required through-electrodes corresponds to the number of flip-flops which carry out data transmission. Therefore, for example, when data is to be transmitted from LGLSI1 to the external communication LSI or LGLSI2, new through-electrodes not shown in FIG. 6 are required. On the other hand, in the configuration of the present embodiment, when data is to be transmitted from LGLSI1 to LGLSI2, the transmission data of LGLSI1 can be input from INS1 and transmitted to LGLSI2 from FF5 via the selector SEL1. Alternatively, data can be input from INS2 and subjected to data transmission from LGLSI1 to the external communication LSI. Thus, when the configuration of the present embodiment is employed, one through-electrode is enough for a data transmission direction, and the number of through-electrodes can be reduced compared with the configuration of the first embodiment.

Figure 10:
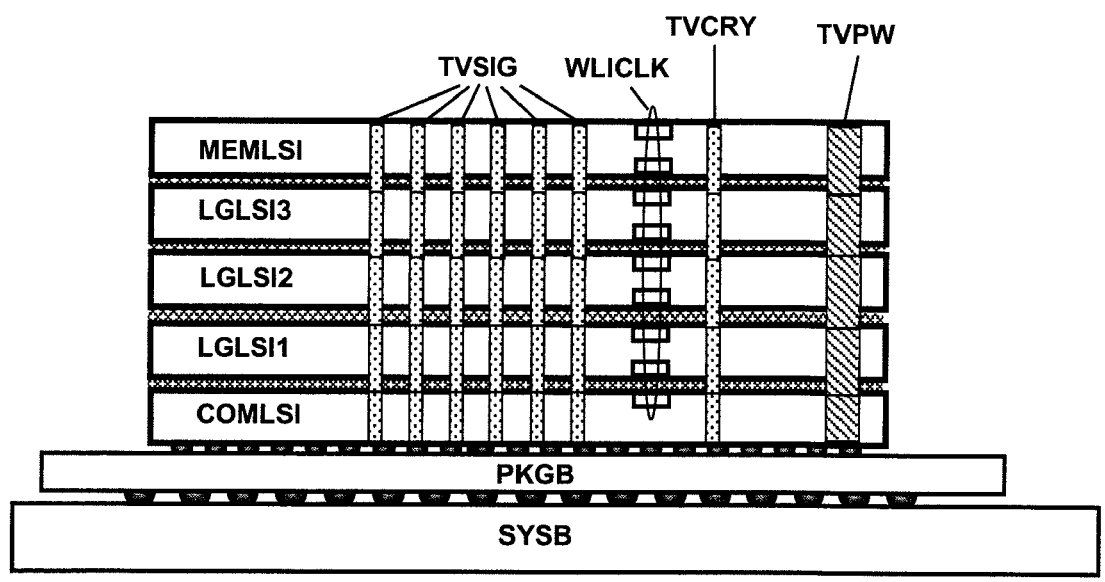
FIG. 10 is an explanatory diagram of a package of stacked LSIs according to a fifth embodiment.

FIG. 10 illustrates an aspect of stacked LSIs according to a fifth embodiment of the present invention. Detailed descriptions will be omitted since this mode basically has the same configuration as that in FIG. 1. In comparison with FIG. 1 of the first embodiment, a feature of the present embodiment lies in that the synchronization clock signal is subjected to induction-coupled wireless communication (WLICLK) by coils.

Figure 11:
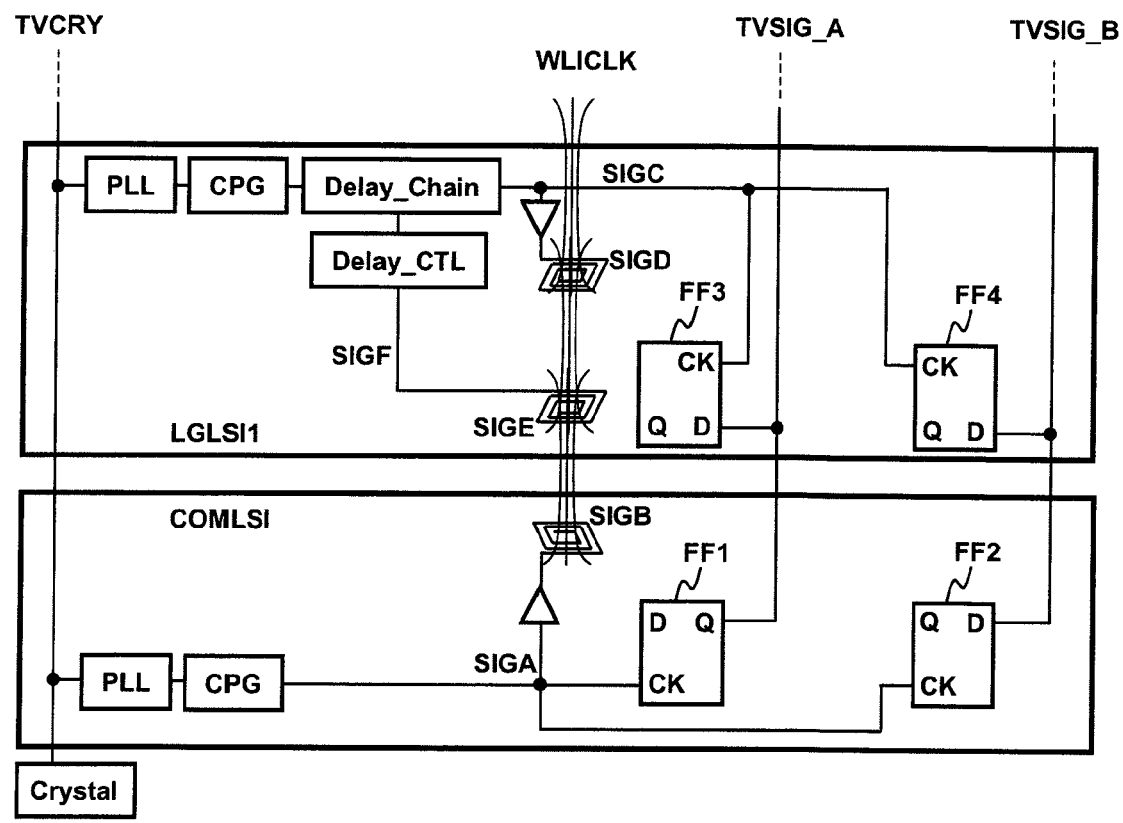
FIG. 11 is an explanatory diagram illustrating a circuit system of synchronization between stacked LSIs according to the fifth embodiment.
Figure 12:
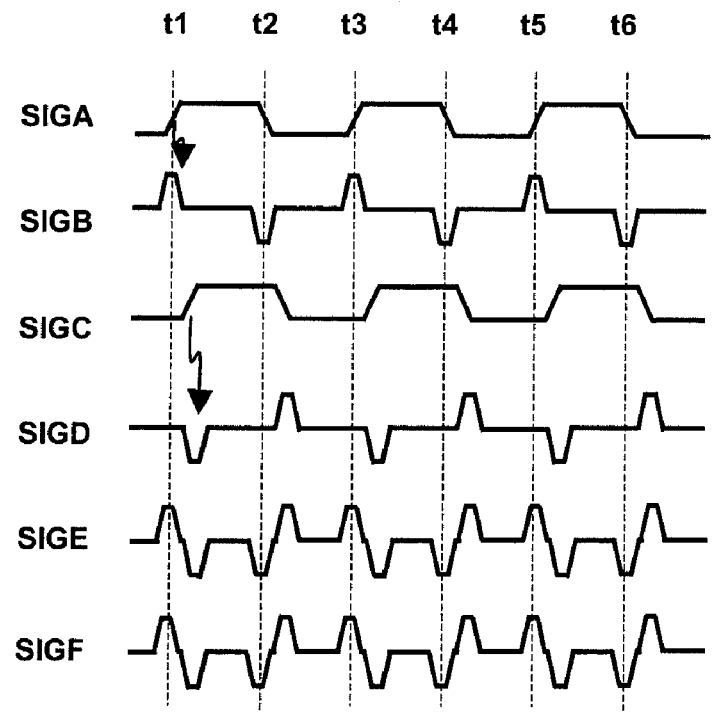
FIG. 12 is an explanatory diagram of operation waveforms according to the fifth embodiment.

FIG. 11 illustrates a diagram of a circuit which enables synchronization of communication and computations between the LSIs according to the fifth embodiment of the present invention. The feature of the present invention lies in that the synchronization clock signal is transmitted by induction-coupled wireless communication by the coils. As a result, the comparators for phase comparators are not required to be specially installed. Operations thereof will be described in combination with waveform diagrams of FIGS. 12 and 13. First, the operation of the case in which the clock phases of the external communication LSI and LGLSI1 are mutually shifted will be described with reference to the waveform diagram of FIG. 12. At rising and falling edges of the reference clock signal (SIGA) of the external communication LSI, an induced electromotive force signal (SIGB) is generated in the coil. Meanwhile, also at rising and falling edges of an internal clock signal (SIGC) of the computing LSI, an induced electromotive force signal (SIGD) is generated in the coil. Herein, the direction of the magnetic field of SIGD is opposite to that of SIGB. An induced electromotive force signal of the case in which the magnetic fields of SIGB and SIGD are received by phase comparator coils is SIGE. Since the phases thereof are mutually shifted, induced electromotive force corresponding to rising and falling edges of the clocks is generated in SIGE. This signal is input to Delay_CTL, an appropriate delay level is set in Delay_Chain, and phases are adjusted to the clocks.

Figure 13:
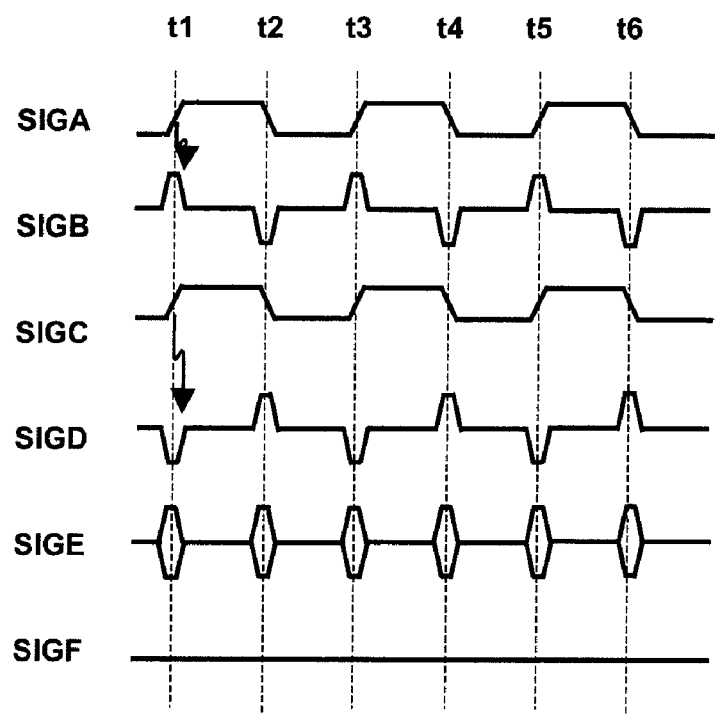
FIG. 13 is an explanatory diagram of operation waveforms according to the fifth embodiment.

FIG. 13 illustrates a waveform diagram of the case in which the clock phases of the external communication LSI and LGLSI1 are matched with each other. At rising and falling edges of the reference clock signal (SIGA) of the external communication LSI, the induced electromotive force signal (SIGB) is generated in the coil. Meanwhile, also at rising and falling edges of the internal clock signal (SIGC) of the computing LSI, the induced electromotive force signal (SIGD) is generated in the coil. Herein, the direction of the magnetic field of SIGD is opposite to that of SIGB. The induced electromotive force signal of the case in which the magnetic fields of SIGB and SIGD are received by the phase comparator coil is SIGE. Since the phases thereof are matched, the magnetic fields thereof are mutually cancelled, and induced electromotive force is not generated in SIGE. It is determined that Delay_CTL have matched phases with this result. In the present embodiment, the need of specially installing the comparators for phase comparators is eliminated by carrying out transmission of the synchronization clock signal by the induced-coupled wireless communication by the coils.

In the foregoing, the preferred embodiments of the present invention have been described based on the embodiments. However, it is needless to say that the present invention is not limited to the foregoing embodiments and various modifications and alterations can be made within the scope of the present invention.

What is claimed is:

1. A semiconductor device comprising:
   a first LSI having a plurality of first flip-flops, to which a first clock signal is supplied, and a first logic circuit connected between the plurality of first flip-flops; and
   a second LSI formed on a chip different from a chip of the first LSI and having a plurality of second flip-flops, to which a second clock signal is supplied, and a second logic circuit connected between the plurality of second flip-flops, wherein
   the first LSI and the second LSI are stacked in one semiconductor package;
   the first LSI transmits data to the second LSI based on the first clock signal;
   the second LSI receives the data transmitted from the first LSI based on the second clock signal;
   the second clock signal is controlled so as to be synchronized with the first clock signal;
   the first clock signal of the first LSI is transmitted to the second LSI through a first through-electrode that mutually electrically connects the first and second LSIs, the first through-electrode being provided to penetrate the second LSI;
the second LSI has a first DLL circuit; and
the first DLL circuit controls a phase of the second clock signal based on the first clock signal supplied via the first through-electrode.

2. A semiconductor device comprising:
a first LSI having a plurality of first flip-flops, to which a first clock signal is supplied, and a first logic circuit connected between the plurality of first flip-flops; and
a second LSI formed on a chip different from a chip of the first LSI and having a plurality of second flip-flops, to which a second clock signal is supplied, and a second logic circuit connected between the plurality of second flip-flops, wherein
the first LSI and the second LSI are stacked in one semiconductor package;
the first LSI transmits data to the second LSI based on the first clock signal;
the second LSI receives the data transmitted from the first LSI based on the second clock signal;
the second clock signal is controlled so as to be synchronized with the first clock signal;
the first LSI has a first circuit block and a second circuit block;
the second LSI has a third circuit block, which receives data transmitted from the first circuit block, and a fourth circuit block, which receives data transmitted from the second circuit block; and
the second LSI has a first DLL circuit, which carries out control so that the second clock signal is synchronized with the clock signal received from the first LSI and supplies the second clock signal to the third circuit block, and a second DLL circuit, which carries out control so that a third clock signal is synchronized with the clock signal received from the first LSI and supplies the third clock signal to the fourth circuit block.

3. A semiconductor device comprising:
a first LSI having a plurality of first flip-flops, to which a first clock signal is supplied, and a first logic circuit connected between the plurality of first flip-flops; and
a second LSI formed on a chip different from a chip of the first LSI and having a plurality of second flip-flops, to which a second clock signal is supplied, and a second logic circuit connected between the plurality of second flip-flops, wherein
the first LSI and the second LSI are stacked in one semiconductor package;
the first LSI transmits data to the second LSI based on the first clock signal;
the second LSI receives the data transmitted from the first LSI based on the second clock signal;
the second clock signal is controlled so as to be synchronized with the first clock signal;
the first LSI has a clock controller circuit which controls the first clock signal transmitted from the first LSI to the second LSI; and
the clock controller circuit transmits the first clock signal only when the first LSI and the second LSI communicate with each other.

4. A semiconductor device comprising:
a first LSI having a plurality of first flip-flops, to which a first clock signal is supplied, and a first logic circuit connected between the plurality of first flip-flops; and
a second LSI formed on a chip different from a chip of the first LSI and having a plurality of second flip-flops, to which a second clock signal is supplied, and a second logic circuit connected between the plurality of second flip-flops, wherein
the first LSI and the second LSI are stacked in one semiconductor package;
the first LSI transmits data to the second LSI based on the first clock signal;
the second LSI receives the data transmitted from the first LSI based on the second clock signal;
the second clock signal is controlled so as to be synchronized with the first clock signal;
the first LSI further has a first wireless communication circuit which transmits the first clock signal; and
the second LSI further has a second wireless communication circuit which receives the first clock signal.

5. The semiconductor device according to claim 4, wherein
the second LSI further has a third wireless communication circuit which transmits the second clock signal;
the first wireless communication circuit transmits the first clock signal by generating a first magnetic field corresponding to the first clock signal;
the second wireless communication circuit transmits the second clock signal by generating a second magnetic field corresponding to the second clock signal; and
the second wireless communication circuit receives both of the first magnetic field and the second magnetic field and generates an induced electromotive force signal so as to compare a phase difference between the first clock signal and the second clock signal.

* * * * *